United States Patent
Hao

(10) Patent No.: US 11,033,850 B2
(45) Date of Patent: Jun. 15, 2021

(54) VACUUM DRYING AND SOLVENT RECOVERY DEVICE

(71) Applicant: Shenzhen China Star Optoelectronics Semiconductor Display Technology Co., Ltd., Shenzhen (CN)

(72) Inventor: Peng Hao, Shenzhen (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 334 days.

(21) Appl. No.: 16/319,350

(22) PCT Filed: Sep. 19, 2018

(86) PCT No.: PCT/CN2018/106576
§ 371 (c)(1),
(2) Date: Jan. 21, 2019

(87) PCT Pub. No.: WO2019/223197
PCT Pub. Date: Nov. 28, 2019

(65) Prior Publication Data
US 2021/0077941 A1    Mar. 18, 2021

(30) Foreign Application Priority Data
May 22, 2018  (CN) .................. 201810497235.4

(51) Int. Cl.
*F26B 5/04* (2006.01)
*B01D 53/00* (2006.01)
*F26B 3/18* (2006.01)
*F26B 21/00* (2006.01)

(52) U.S. Cl.
CPC .............. *B01D 53/002* (2013.01); *F26B 5/04* (2013.01); *F26B 3/18* (2013.01); *F26B 21/00* (2013.01)

(58) Field of Classification Search
CPC ..... B01D 53/002; B01D 2257/80; F26B 5/04; F26B 21/00; F26B 3/18
USPC .......................................................... 34/406
See application file for complete search history.

(56) References Cited

U.S. PATENT DOCUMENTS

| | | | |
|---|---|---|---|
| 4,622,039 A * | 11/1986 | Merenda | D06L 1/10 134/12 |
| 2015/0183404 A1* | 7/2015 | Romack | B60S 1/52 134/34 |
| 2019/0076782 A1* | 3/2019 | Nishikunibaru | B01D 53/8671 |

FOREIGN PATENT DOCUMENTS

| | | |
|---|---|---|
| CN | 1974459 A | 6/2007 |
| CN | 202297161 U | 7/2012 |
| EP | 0381887 A1 | 8/1990 |
| JP | H03101866 A | 4/1991 |

(Continued)

*Primary Examiner* — John P McCormack
(74) *Attorney, Agent, or Firm* — Leong C. Lei

(57) ABSTRACT

Disclosed is a vacuum drying and solvent recovery device, including a vacuum drying system for drying an ink jet printing (IJP) ink by volatilizing a solvent in the IJP ink and a solvent recovery system for recovering the solvent volatilized from the IJP ink. By integrating the solvent recovery system outside the vacuum drying system and providing a plurality of solvent recovery chambers in the solvent recovery system to condense and recover solvents for various systems, the recycling of the solvents in the IJP inks and the reduction of production costs can be achieved.

9 Claims, 2 Drawing Sheets

(56) References Cited

FOREIGN PATENT DOCUMENTS

| JP | H0854184 A | 2/1996 |
| JP | 4022186 B2 | 12/2007 |

\* cited by examiner

VACUUM DRYING AND SOLVENT RECOVERY DEVICE

FIELD OF THE INVENTION

The present invention relates to a display field, and more particularly to a vacuum drying and solvent recovery device.

BACKGROUND OF THE INVENTION

The Organic Light Emitting Diode (OLED) with the advantages of self-lighting, all solid state, high contrast, etc. has become the most potential new type display element in recent years. The OLED display device possesses many outstanding properties of self-illumination, low driving voltage, high luminescence efficiency, fast response, high clarity and contrast, near 180° view angle, wide range of working temperature, applicability of flexible display and large scale full color display. The OLED is considered as the most potential flat panel display technology.

The OLED display element generally comprises a substrate, an anode located on the substrate, a hole injection layer located on the anode, a hole transporting layer located on the hole injection layer, an emitting layer located on the hole transporting layer, an electron transporting layer located on the emitting layer, an electron injection layer located on the electron transporting layer and a cathode located on the electron injection layer. The principle of the OLED element is that the illumination generates due to the carrier injection and recombination under the electric field driving of the semiconductor material and the organic semiconductor illuminating material. Specifically, the ITO pixel electrode and the metal electrode are respectively employed as the anode and the cathode of the OLED element. Under certain voltage driving, the Electron and the Hole are respectively injected into the Electron and Hole Transporting Layers from the cathode and the anode. The Electron and the Hole respectively migrate from the Electron and Hole Transporting Layers to the Emitting layer and bump into each other in the Emitting layer to form an exciton to excite the emitting molecule. The latter can illuminate after the radiative relaxation.

At present, the respective function material layers and the cathode metal layer are manufactured by vacuum thermal evaporating. In the vacuum chamber, the organic small molecule material is heated to be sublimated or gasified to be material vapor. Then, it deposed on the glass substrate with the opens of the metal mask (Mask). However, due to the low material utilization rate, high preparation cost and poor film formation uniformity of the vacuum thermal evaporation process, there has been no effective solution, which limits the wide-ranging commercialization of OLED displays. The preparation of OLED film by solution method shows obvious advantages due to the high material utilization rate and low equipment cost. The solution method includes spin coating, printing and etc., a film formation method, in which an ink containing an OLED functional material is dropped in tiny droplets at predetermined positions, and then the solvent is evaporated and removed to leave only the solute (OLED function material), is referred to as Ink-jet Print (IJP). This method is currently the most suitable process for OLED light emitting elements. Compared with the traditional vacuum evaporation process, it possesses many advantages, such as saving materials, mild process conditions and more uniform film formation, so this method possesses more application potentials.

A common method for removing solvent components in ink is to place the substrate in a vacuum chamber, to rapidly evaporate the solvent under negative pressure, and then to process the solvent-containing exhaust gas for an exhaust gas treatment. For meeting the precision requirements of the print head, the solvent used by IJP has high requirements on boiling point, viscosity, surface tension and compatibility with solute, thus the solvent cost is high.

SUMMARY OF THE INVENTION

An objective of the present invention is to provide a vacuum drying and solvent recovery device to integrate a solvent recovery system outside the vacuum drying system to condense and recover solvent volatilized in a vacuum chamber for recycling utilization to reduce the production costs.

For realizing the aforesaid objective, the present invention provides a vacuum drying and solvent recovery device, comprising a vacuum drying system for drying an ink jet printing (IJP) ink by volatilizing a solvent in the IJP ink and a solvent recovery system for recovering the solvent volatilized from the IJP ink;

wherein the vacuum drying system comprises a vacuum chamber and a vacuum exhaust pump set connected to the vacuum chamber;

the solvent recovery system comprises a plurality of solvent recovery chambers, an exhaust gas treatment unit coupled to the plurality of solvent recovery chambers and a valve switching unit for selectively conducting the vacuum exhaust pump set, one of the plurality of solvent recovery chambers and the exhaust gas treatment unit;

in use, the vacuum exhaust pump set provides a negative pressure environment to the vacuum chamber, so that the solvent in the IJP ink is volatilized under the negative pressure environment of the vacuum chamber and is extracted from the vacuum chamber by the vacuum exhaust pump set to dry the IJP ink; the valve switching unit connects the solvent recovery chamber with the vacuum exhaust pump set, so that gas discharged from the vacuum exhaust pump set is conducted into the solvent recovery chamber and cooled by the solvent recovery chamber to condense and recovery the solvent, and to discharge remaining gas to the exhaust gas treatment unit for exhaust gas treatment; or the valve switching unit directly connects the exhaust gas treatment unit with the vacuum exhaust pump set, so that the gas discharged from the vacuum exhaust pump set is conducted to the exhaust gas treatment unit for exhaust gas treatment.

Each solvent recovery chamber comprises a cooling box, a condensation tube disposed in the cooling box and connected to the valve switching unit at a front end for condensing the solvent in the gas, a recovery container disposed in the cooling box and connected to the condensation tube at a rear end for receiving the solvent condensed in the condensation tube, an exhaust pipe connected to a recovery container for the discharging uncondensed residual gas in the condensation tube to the exhaust gas treatment unit and a cooling unit for cooling the condensation tube in the cooling box.

In use, a temperature in the solvent recovery chamber is set to −20 degrees Celsius to 10 degrees Celsius.

The condensation tube is made of glass.

A total length of the condensation tube is greater than 20 m.

The condensation tube is spiral.

An outer wall of the cooling box is made of a heat insulating material.

The cooling unit is a water bath cooler or a compressed air cooler.

The vacuum exhaust pump set comprises a molecular pump disposed under the vacuum chamber, a first pre-stage pump in communication with an upper end of the vacuum chamber and a second pre-stage pump in communication with an outlet end of the molecular pump.

The IJP ink is an IJP ink used to form a functional layer of an organic light emitting diode (OLED) device.

The benefits of the present invention are: the vacuum drying and solvent recovery device provided by the present invention includes a vacuum drying system for drying an ink jet printing (IJP) ink by volatilizing a solvent in the IJP ink and a solvent recovery system for recovering the solvent volatilized from the IJP ink. By integrating the solvent recovery system outside the vacuum drying system and providing a plurality of solvent recovery chambers in the solvent recovery system to condense and recover solvents for various systems, the recycling of the solvents in the IJP inks can be achieved to reduce the production costs.

In order to better understand the characteristics and technical aspect of the invention, please refer to the following detailed description and accompanying drawings of the present invention. However, the drawings are provided for reference only and are not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
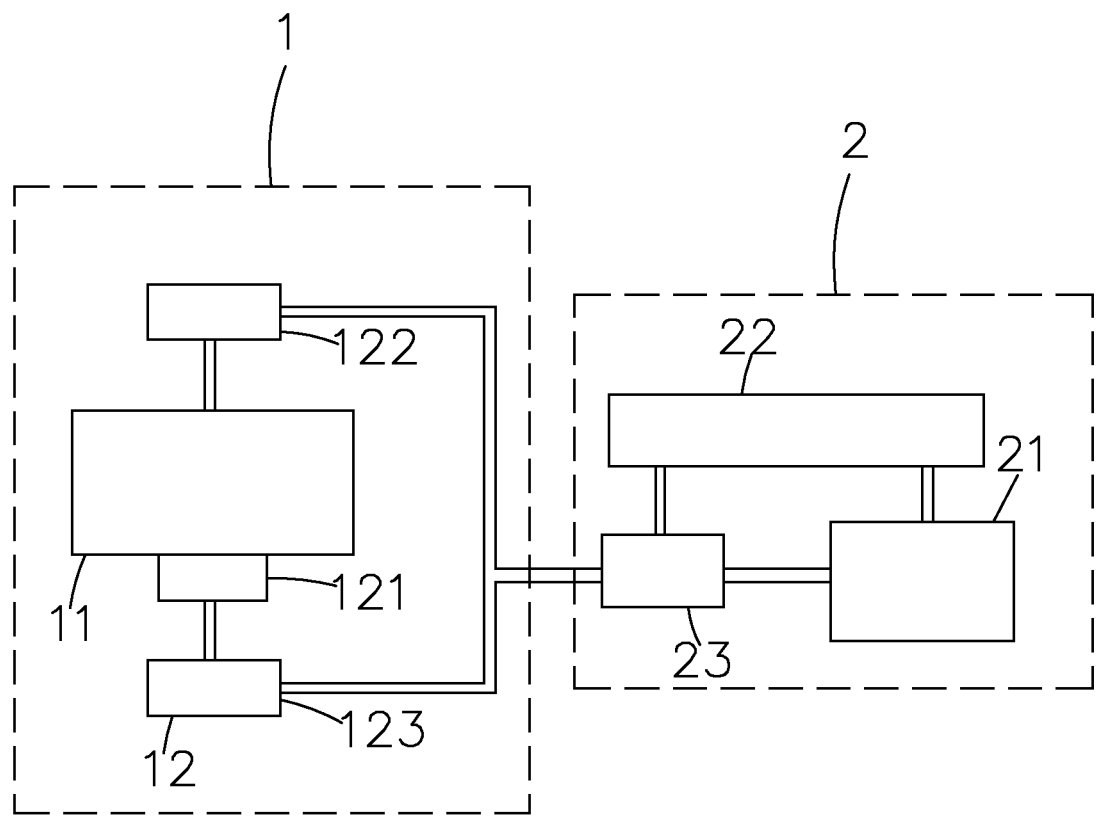
FIG. 1 is a structural diagram of a vacuum drying and solvent recovery device of the present invention.
Figure 2:
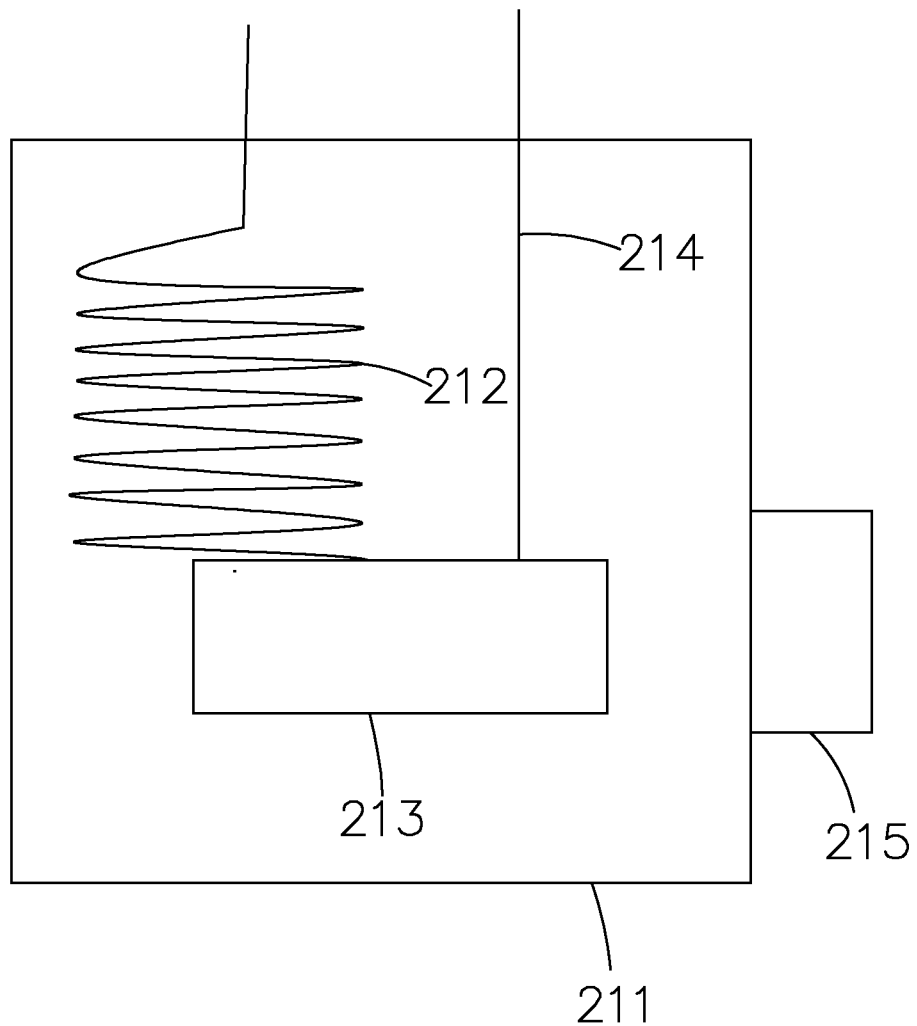
FIG. 2 is a structural diagram of a solvent recovery chamber in the vacuum drying and solvent recovery device of the present invention.

As shown in FIG. 1, the present invention provides a vacuum drying and solvent recovery device, comprising a vacuum drying system 1 for drying an ink jet printing (IJP) ink by volatilizing a solvent in the IJP ink and a solvent recovery system 2 for recovering the solvent volatilized from the IJP ink;

wherein the vacuum drying system comprises a vacuum chamber 11 and a vacuum exhaust pump set 12 connected to the vacuum chamber 11;

the solvent recovery system 2 comprises a plurality of solvent recovery chambers 21, an exhaust gas treatment unit 22 coupled to the plurality of solvent recovery chambers 21 and a valve switching unit 23 for selectively conducting the vacuum exhaust pump set 12, one of the plurality of solvent recovery chambers 21 and the exhaust gas treatment unit 22;

in use, the vacuum exhaust pump set 12 provides a negative pressure environment to the vacuum chamber 11, so that the solvent in the IJP ink is volatilized under the negative pressure environment of the vacuum chamber 11 and is extracted from the vacuum chamber 11 by the vacuum exhaust pump set 12 to dry the IJP ink; according to the specific situation of gas extracted from the vacuum chamber 11 by the vacuum exhaust pump set 12, the valve switching unit 23 connects the solvent recovery chamber 21 with the vacuum exhaust pump set 12, so that the gas discharged from the vacuum exhaust pump set 12 is conducted into the solvent recovery chamber 21 and cooled by the solvent recovery chamber 21 to condense and recovery the solvent, and to discharge remaining gas to the exhaust gas treatment unit 22 for exhaust gas treatment; or the valve switching unit 23 directly connects the exhaust gas treatment unit 22 with the vacuum exhaust pump set 12, so that the gas discharged from the vacuum exhaust pump set 12 is conducted to the exhaust gas treatment unit 22 for exhaust gas treatment.

Specifically, each solvent recovery chamber 21 comprises a cooling box 211, a condensation tube 212 disposed in the cooling box 211 and connected to the valve switching unit 23 at a front end for condensing the solvent in the gas, a recovery container 213 disposed in the cooling box 211 and connected to the condensation tube 212 at a rear end for receiving the solvent condensed in the condensation tube 212, an exhaust pipe 214 connected to a recovery container 213 for the discharging uncondensed residual gas in the condensation tube 212 to the exhaust gas treatment unit 22 and a cooling unit 215 for cooling the condensation tube 212 in the cooling box 211.

Specifically, in use, a temperature in the solvent recovery chamber 21 is set to −20 degrees Celsius to 10 degrees Celsius.

Specifically, in order to observe the condensation of the solvent in the condensation tube 212 in real time, the condensation tube 212 is preferably made of a transparent glass material.

Specifically, in order to ensure that the solvent volatilized from the IJP ink can be sufficiently condensed in the condenser tube 212, a total length of the condenser tube 212 is greater than 20 m.

Specifically, the condensation tube 212 is spirally bent to the cooling box 211.

Specifically, an outer wall of the cooling box 211 is made of a heat insulating material.

Specifically, the cooling unit 215 is a water bath cooler or a compressed air cooler.

Specifically, the vacuum exhaust pump set 12 comprises a molecular pump 121 disposed under the vacuum chamber 11, a first pre-stage pump 122 in communication with an upper end of the vacuum chamber 11 and a second pre-stage pump 123 in communication with an outlet end of the molecular pump 121.

Specifically, the IJP ink is an IJP ink used to form a functional layer of an organic light emitting diode (OLED) device.

The vacuum drying and solvent recovery device of the present invention integrates a solvent recovery system 2 outside the vacuum drying system 1, and provides a plurality of solvent recovery chambers 21 in the solvent recovery system 2 to condense and recover solvents for various systems to achieve the recycling of the solvents in the IJP inks and the reduction of production costs.

In conclusion, the vacuum drying and solvent recovery device provided by the present invention includes a vacuum drying system for drying an ink jet printing (IJP) ink by volatilizing a solvent in the IJP ink and a solvent recovery system for recovering the solvent volatilized from the IJP ink. By integrating the solvent recovery system outside the vacuum drying system and providing a plurality of solvent recovery chambers in the solvent recovery system to condense and recover solvents for various systems, the recycling of the solvents in the IJP inks and the reduction of production costs can be achieved.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A vacuum drying and solvent recovery device, comprising a vacuum drying system for drying an ink jet printing (IJP) ink by volatilizing a solvent in the IJP ink and a solvent recovery system for recovering the solvent volatilized from the IJP ink;
   wherein the vacuum drying system comprises a vacuum chamber and a vacuum exhaust pump set connected to the vacuum chamber;
   the solvent recovery system comprises a plurality of solvent recovery chambers, an exhaust gas treatment unit coupled to the plurality of solvent recovery chambers and a valve switching unit for selectively conducting the vacuum exhaust pump set, one of the plurality of solvent recovery chambers and the exhaust gas treatment unit;
   in use, the vacuum exhaust pump set provides a negative pressure environment to the vacuum chamber, so that the solvent in the IJP ink is volatilized under the negative pressure environment of the vacuum chamber and is extracted from the vacuum chamber by the vacuum exhaust pump set to dry the IJP ink; the valve switching unit connects the solvent recovery chamber with the vacuum exhaust pump set, so that gas discharged from the vacuum exhaust pump set is conducted into the solvent recovery chamber and cooled by the solvent recovery chamber to condense and recover the solvent, and to discharge remaining gas to the exhaust gas treatment unit for exhaust gas treatment; or the valve switching unit directly connects the exhaust gas treatment unit with the vacuum exhaust pump set, so that the gas discharged from the vacuum exhaust pump set is conducted to the exhaust gas treatment unit for exhaust gas treatment;
   wherein each solvent recovery chamber comprises a cooling box, a condensation tube disposed in the cooling box and connected to the valve switching unit at a front end for condensing the solvent in the gas, a recovery container disposed in the cooling box and connected to the condensation tube at a rear end for receiving the solvent condensed in the condensation tube, an exhaust pipe connected to a recovery container for the discharging uncondensed residual gas in the condensation tube to the exhaust gas treatment unit and a cooling unit for cooling the condensation tube in the cooling box.

2. The vacuum drying and solvent recovery device according to claim 1, wherein in use, a temperature in the solvent recovery chamber is set to −20 degrees Celsius to 10 degrees Celsius.

3. The vacuum drying and solvent recovery device according to claim 1, wherein the condensation tube is made of glass.

4. The vacuum drying and solvent recovery device according to claim 1, wherein a total length of the condensation tube is greater than 20 m.

5. The vacuum drying and solvent recovery device according to claim 1, wherein the condensation tube is spiral.

6. The vacuum drying and solvent recovery device according to claim 1, wherein an outer wall of the cooling box is made of a heat insulating material.

7. The vacuum drying and solvent recovery device according to claim 1, wherein the cooling unit is a water bath cooler or a compressed air cooler.

8. The vacuum drying and solvent recovery device according to claim 1, wherein the vacuum exhaust pump set comprises a molecular pump disposed under the vacuum chamber, a first pre-stage pump in communication with an upper end of the vacuum chamber and a second pre-stage pump in communication with an outlet end of the molecular pump.

9. The vacuum drying and solvent recovery device according to claim 1, wherein the IJP ink is an IJP ink used to form a functional layer of an organic light emitting diode (OLED) device.

* * * * *